(12) United States Patent
Lee et al.

(10) Patent No.: US 8,786,173 B2
(45) Date of Patent: Jul. 22, 2014

(54) MASTER GLASS HAVING STRUCTURE CAPABLE OF PREVENTING DAMAGE CAUSED BY STATIC ELECTRICITY

(75) Inventors: Jae-Yong Lee, Yongin (KR); Won-Kyu Kwak, Yongin (KR); Jae-Jung Kim, Yongin (KR); Tae-Jin Park, Yongin (KR); Dong-Young Sung, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 385 days.

(21) Appl. No.: 12/837,354

(22) Filed: Jul. 15, 2010

(65) Prior Publication Data

US 2011/0043095 A1 Feb. 24, 2011

(30) Foreign Application Priority Data

Aug. 20, 2009 (KR) .......................... 10-2009-0077046

(51) Int. Cl.
*H01L 23/60* (2006.01)
*H01L 23/62* (2006.01)

(52) U.S. Cl.
USPC ............................ 313/500; 257/355; 313/498

(58) Field of Classification Search
USPC ................................................ 313/483–512
See application file for complete search history.

(56) References Cited

U.S. PATENT DOCUMENTS

| 3,556,366 A | * | 1/1971 | Kim .................................. 225/1 |
| 2003/0030054 A1 | * | 2/2003 | Hector et al. .................... 257/72 |
| 2004/0196219 A1 | * | 10/2004 | Kaneko et al. ................. 345/76 |
| 2006/0225463 A1 | | 10/2006 | Sugimoto et al. |
| 2007/0278581 A1 | * | 12/2007 | Boselli et al. ................. 257/362 |
| 2007/0281225 A1 | | 12/2007 | McMonagle |
| 2011/0000635 A1 | | 1/2011 | Sugimoto et al. |
| 2012/0021548 A1 | | 1/2012 | Yamazaki et al. |

FOREIGN PATENT DOCUMENTS

| JP | 08148770 A | * | 6/1996 |
| JP | 2001237073 A | | 8/2001 |
| JP | 2004087466 A | | 3/2004 |
| JP | 2004327272 A | | 11/2004 |
| JP | 200550614 A | | 2/2005 |
| JP | 2007265850 A | | 10/2007 |

(Continued)

OTHER PUBLICATIONS

Japanese Office Action issued by Japanese Patent Office on Jan. 10, 2012 in the corresponding Japanese Patent Application Serial No. 2009-258060, which also claims Korean Patent Application Serial No. 10-2009-0077046 as its priority document and Request for Entry of the Accompanying Office Action attached herewith.

(Continued)

*Primary Examiner* — Karabi Guharay
*Assistant Examiner* — Nathaniel Lee
(74) *Attorney, Agent, or Firm* — Robert E. Bushnell, Esq.

(57) ABSTRACT

There is provided a master glass having a structure capable of preventing damage caused by static electricity. The master glass is a substrate on which a deposition process is experimentally performed by being experimentally loaded loading the master glass into a deposition apparatus before starting the deposition process of the substrate for electronic devices. In one embodiment, a master glass includes first conductive patterns and a second conductive pattern. The first conductive patterns are formed to correspond to a deposition pattern required in a substrate for electronic devices. The second conductive pattern electrically connects all the first conductive patterns to one another.

14 Claims, 4 Drawing Sheets

(56) References Cited

FOREIGN PATENT DOCUMENTS

| KR | 20060133241 A | 12/2006 |
|---|---|---|
| KR | 10-2007-0068035 | 6/2007 |
| KR | 10-2007-0079526 | 8/2007 |

OTHER PUBLICATIONS

Korean Office Action issued by KIPO, dated Jan. 19, 2011, corresponding to Korean Patent Application No. 10-2009-0077046, together with Request for Entry.

* cited by examiner

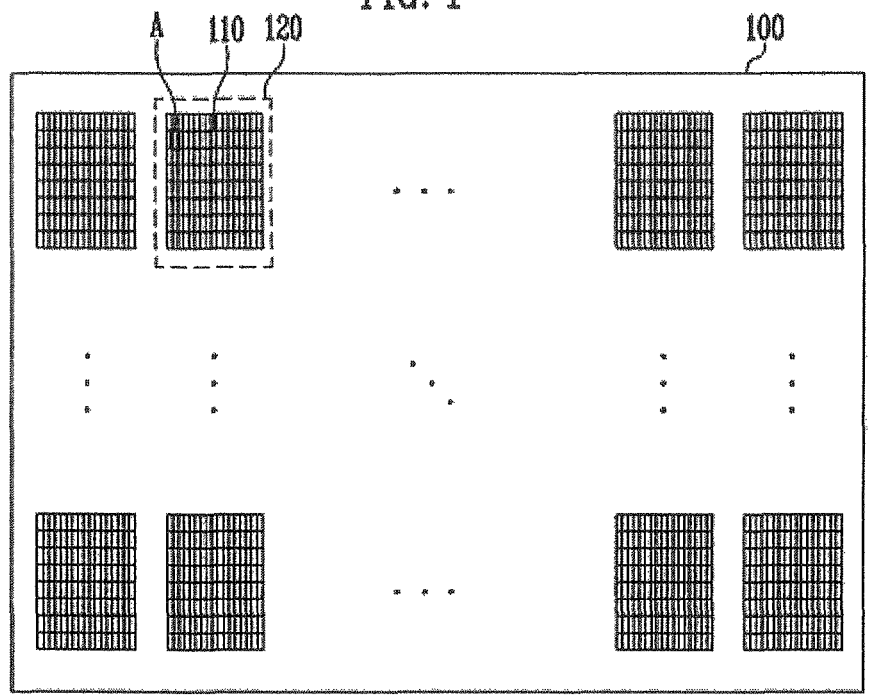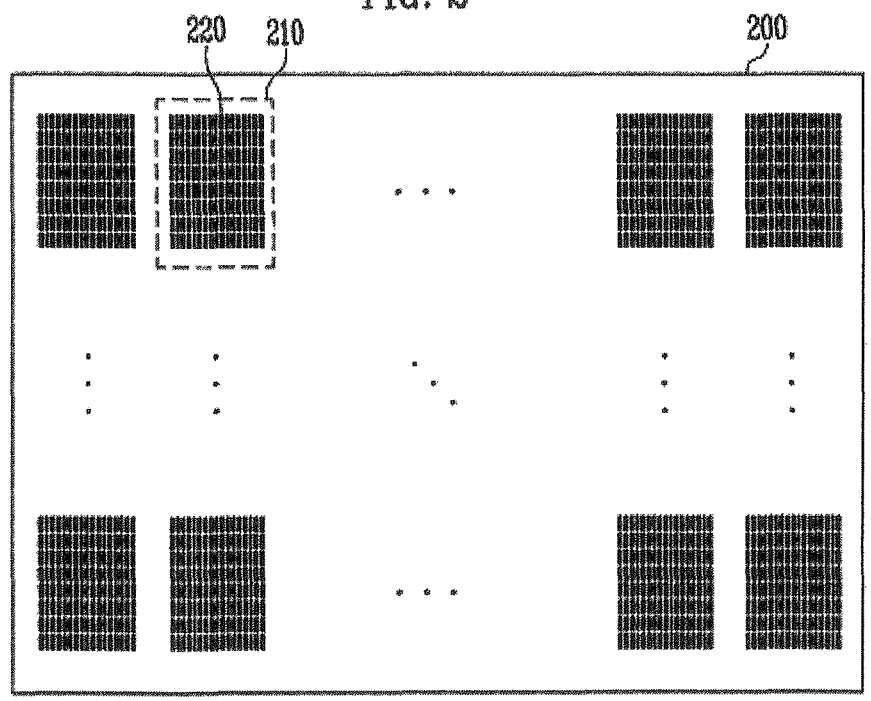

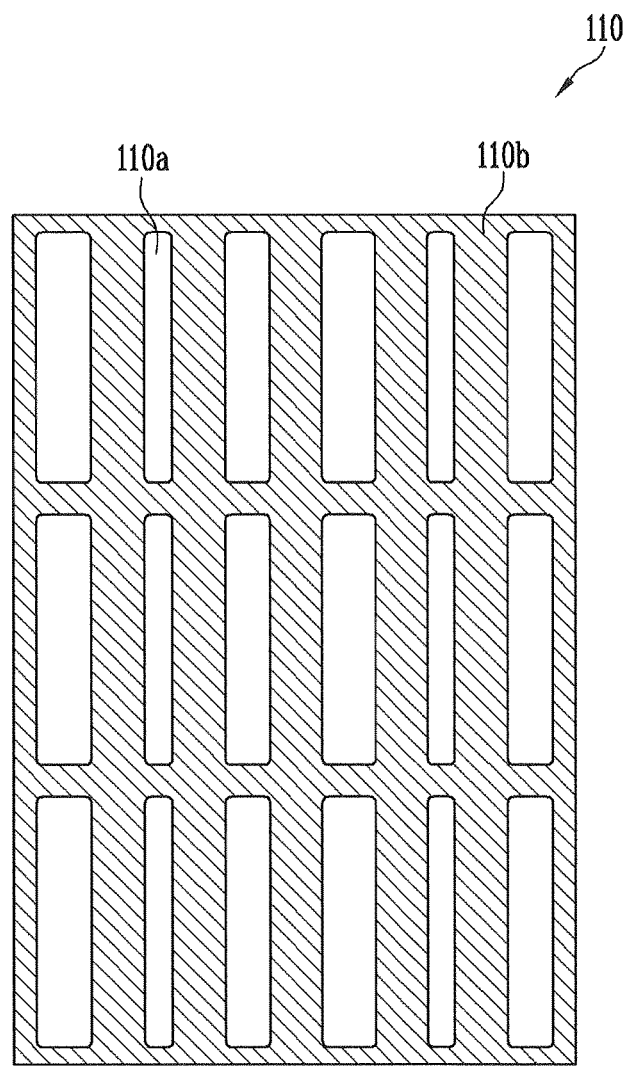

MASTER GLASS HAVING STRUCTURE CAPABLE OF PREVENTING DAMAGE CAUSED BY STATIC ELECTRICITY

CLAIM OF PRIORITY

This application makes reference to, incorporates the same herein, and claims all benefits accruing under 35 U.S.C. §119 from an application earlier filed in the Korean Intellectual Property Office on 20 Aug. 2009 and there duly assigned. Serial No. 10-2009-0077046.

BACKGROUND OF THE INVENTION

1. Field of the Invention

An aspect of the present invention relates to a master glass having conductive patterns formed thereon, and more particularly, to a master glass having a structure capable of preventing damage caused by static electricity.

2. Description of the Related Art

Panels in a variety of display devices such as an organic light emitting display device are fabricated by forming pixels on a mother substrate through a deposition process or the like and then scribing the mother substrate into individual panels.

The deposition process is performed in a deposition apparatus using a deposition mask. To prevent deposition failure in advance, the condition of the deposition mask and the performance and operation conditions of the deposition apparatus are necessarily inspected before a mother substrate is loaded into the deposition apparatus.

To this end, a method may be used to test a deposition apparatus by experimentally loading a master glass into the deposition apparatus and then by performing a deposition process on the master glass. Here, patterns of a deposition mask may be formed on the master glass, and the patterns and deposition conditions may be inspected.

However, a master glass having conductive patterns formed thereon is easily broken in the deposition apparatus because of its weakness for static electricity. In this case that the master glass is broken, the preliminary inspection to be performed before a mother substrate is loaded into the deposition apparatus may not be successfully conducted. Therefore, process efficiency may be lowered, and the percentage of failures may be increased, all concomitant with an urgent need for replacement of the broken master glass.

SUMMARY OF THE INVENTION

Accordingly, there is provided a master glass having a structure capable of preventing damage caused by static electricity.

According to an aspect of the present invention, there is provided a master glass including a plurality of first conductive patterns, and a second conductive pattern for electrically connecting all the first conductive patterns to one another. Each of the first conductive patterns is formed to correspond to a deposition pattern required in a substrate for electronic devices.

The substrate for electronic devices may be a mother substrate for fabricating a plurality of organic light emitting display panels. The deposition pattern may be a pattern of light emitting portions of each of the organic light emitting display panels on which an organic layer is formed, and conductive layers of each of the first conductive patterns may be formed aligned with regions between the light emitting portions. Particularly, the first conductive patterns may include a lattice pattern. The first conductive patterns may be formed aligned with one of the organic light emitting display panels of the substrate for electronic devices, and the second conductive pattern is formed in a space between the first conductive patterns.

The first and second conductive patterns may be integrally formed of the same material. The first and second conductive patterns may be formed of the same metallic material. The master glass may further include a shorting bar formed at an edge portion of the master glass. The shorting bar is electrically connected to one of the first conductive patterns. The shorting bar surrounds all of the first conductive patterns.

The substrate for electronic devices may include a deposition substrate for fabricating display panels on which a deposition material is formed, and conductive layers of the first and second patterns may be positioned aligned with the region excluding the region of the deposition substrate on which the deposition material is formed.

According to the present invention, conductive patterns formed on a master glass, corresponding to a deposition pattern required in a substrate for electronic devices are all connected electrically to one another, thereby preventing damage of the master glass, caused by static electricity.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 1 is a plan view illustrating an example of a master glass having conductive patterns formed thereon.

FIG. 2 is a plan view illustrating an example of a substrate for electronic devices.

FIG. 3 is an enlarged plan view of area A in FIG. 1.

DETAILED DESCRIPTION OF THE INVENTION

Figure 4:
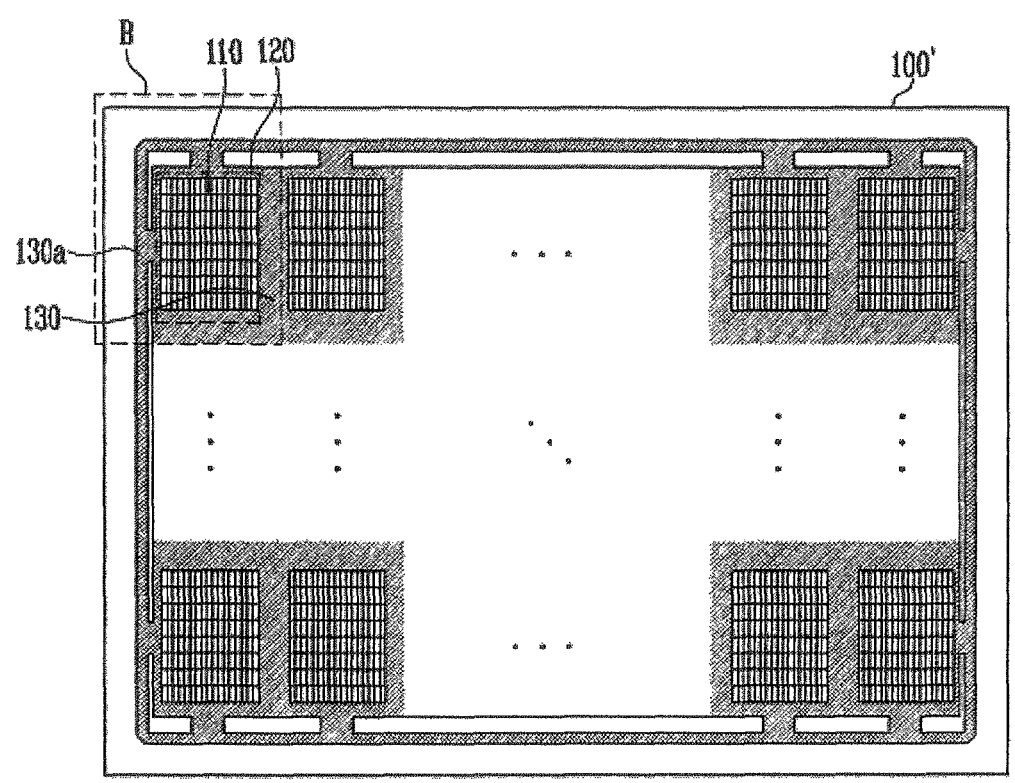
FIG. 4 is a plan view illustrating an example of a master glass fabricated according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

FIG. 1 is a plan view illustrating an example of a master glass having conductive patterns formed thereon. FIG. 2 is a plan view illustrating an example of a substrate for electronic devices. FIG. 3 is an enlarged plan view of area A in FIG. 1.

Referring to FIG. 1, a master glass 100 includes first conductive patterns 110 formed to correspond to a deposition pattern required in a substrate for electronic devices.

The master glass 100 is a substrate on which a deposition process is experimentally performed by loading the master glass 100 into a deposition apparatus before starting the deposition process of the substrate for electronic devices. The master glass 100 is fabricated to include a substrate and first conductive patterns 110, which are formed on a surface of the substrate. The first conductive pattern 110 corresponds to the deposition pattern to be deposited on the substrate for electronic devices. Herein, the meaning of "one pattern" corresponding to "another pattern" is that the one pattern is related to the another pattern. For example, the one pattern may be substantially the same as another pattern, or the "one pattern" may be a complementary pattern of "another pattern." Herein, the complementary pattern of "another pattern" is a pattern in which elements of "one pattern" is aligned on positions on which elements of "another pattern" are not formed. For another example, the "one pattern" may be a partial complementary pattern of "another pattern," in which only some elements of the "one pattern" and "another pattern" are aligned not to overlap.

To this end, the substrate of the master glass 100 may be selected as a substrate formed to have a size or material identical or similar to that of the substrate for electronic devices. The first conductive patterns 110 may be formed as patterns corresponding to the deposition pattern. The master glass 100 can be referred to as a master substrate 100 if the master substrate 100 is made of a different material other than glass.

The substrate for electronic devices may be set as a deposition substrate for fabricating a display panel. In this case, the first conductive patterns 110 are formed as patterns corresponding to components of the display panel on which an actual deposition process is performed after a test deposition on the master glass 100. For example, the substrate for electronic devices may be set as a substrate for fabricating an organic light emitting display panel. Particularly, when a plurality of organic light emitting display panels are formed on one substrate and the substrate is then scribed, the substrate for electronic devices may be set as a mother substrate 200 for fabricating a plurality of organic light emitting display panels 210 as illustrated in FIG. 2.

That is, before a deposition process of the mother substrate 200 is performed in the process of fabricating the organic light emitting display panels 210, the deposition process is performed experimentally by loading the master glass 100, instead of the mother substrate 200, into a deposition apparatus. After the deposition process, the master glass 100 is inspected through a microscope or the like, thereby checking the performance and operation conditions of the deposition apparatus, and the like.

For example, before an organic layer such as a light emitting layer is deposited on light emitting portions (light emitting portions of R, G and B pixels) 220 of each of the organic light emitting display panels 210 formed on the mother substrate 200, a deposition process is performed experimentally by loading a master glass 100 into a deposition apparatus for performing an organic layer deposition process, so that the deposition apparatus can be tested by inspecting the master glass 100.

The master glass 100 may include first conductive patterns 110, which includes conductive layers 110b (pattern elements). The conductive layers 110b are formed in regions of the master glass 100, which are aligned with regions between the light emitting portions 220 of the mother glass 200. Accordingly, no conductive layer is formed on regions of the master glass 100, which are aligned with the light emitting portions 220 of each of the organic light emitting display panels.

That is, as illustrated in FIG. 3, each of the first conductive patterns 110 may have openings 110a aligned with the light emitting portions 220 formed on the mother glass 200. Herein, the meaning of an opening 110a includes a region on which no conductive layer is formed. Therefore, the openings 110a are visibly distinguished from the regions on which conductive layers of the conductive pattern 110 are formed. As shown in FIG. 3, the first conductive pattern 110 is formed of openings 110a and conductive layers 110b. Depending on a deposition pattern of the mother glass 200, the first conductive pattern 110 may be a lattice pattern, in which openings 110 are disposed between conductive layers 110b and are arranged in a lattice structure. A cell 120, which includes the conductive pattern 110, corresponds to an organic light emitting display panel 210, which is to be built on the mother glass 200.

In other words, the first conductive pattern 110 formed in one cell 120 corresponds to one of deposition patterns of an organic light emitting display panel 210. Conductive layers 110b (pattern elements) of the first conductive pattern 110 may be disposed on regions of the master glass 100, which correspond to regions between light emitting portions 220 of the organic light emitting display panel 210. The openings 110a of the conductive pattern 110 may have a lattice structure in order to correspond to the arrangement of the light emitting portions 220 of the organic light emitting display panel 210.

Over the entire master glass 100, a plurality of first conductive patterns 110 may be formed corresponding to the arrangement of a plurality of organic light emitting display panels 210 formed on the mother substrate 200. Each of the first conductive patterns 110 corresponds to one of the organic emitting display panels 210.

The deposition process is performed experimentally by loading the master glass 100 into a deposition apparatus, and the performance and operation conditions of the deposition apparatus and the like can be checked by inspecting the deposition results obtained by performing this experimental deposition process.

Meanwhile, in addition to the aforementioned deposition inspection, the master glass 100 may be used for an inspection of a deposition mask through comparison of the first conductive patterns 110 before a deposition process and deposition patterns after the deposition process.

Herein, the deposition mask may include an assembly of a plurality of fine metal masks (FMMs), which have a size corresponding to that of the mother substrate 200. The plurality of FMMs may be used to form an organic layer of an organic light emitting display device, and the like.

In this case, the FMMs can be assembled with reference to the first conductive patterns 110 formed on the master glass 100 before the master glass 100 is loaded into the deposition apparatus. After a test deposition on the master glass 100, the assembly result of the FMMs can also be inspected by inspecting the deposition condition of the master glass 100, thereby improving assembly accuracy of the FMMs.

It will be apparent that the master glass 100 having a test deposition pattern after the test deposition process can also be used as a reference for assembling the FMMs.

That is, the master glass 100 may be used for various purposes including for inspection of a deposition mask, assembly reference for FMMs, and inspection of deposition conditions, and the like.

Meanwhile, the first conductive patterns 110 may be formed of a metallic material. Conductive layers of a first conductive pattern 110 are electrically connected in each of the cells 120, but each of the cells 120 is electrically isolated from one another. Accordingly, the master glass 100 is weak for static electricity.

Therefore, in an embodiment of the present invention, all the first conductive patterns 110 on the master glass 100 are electrically connected to one another so as to prevent damage caused by the static electricity. Its detailed description will be described later with reference to FIGS. 4 and 5.

Figure 5:
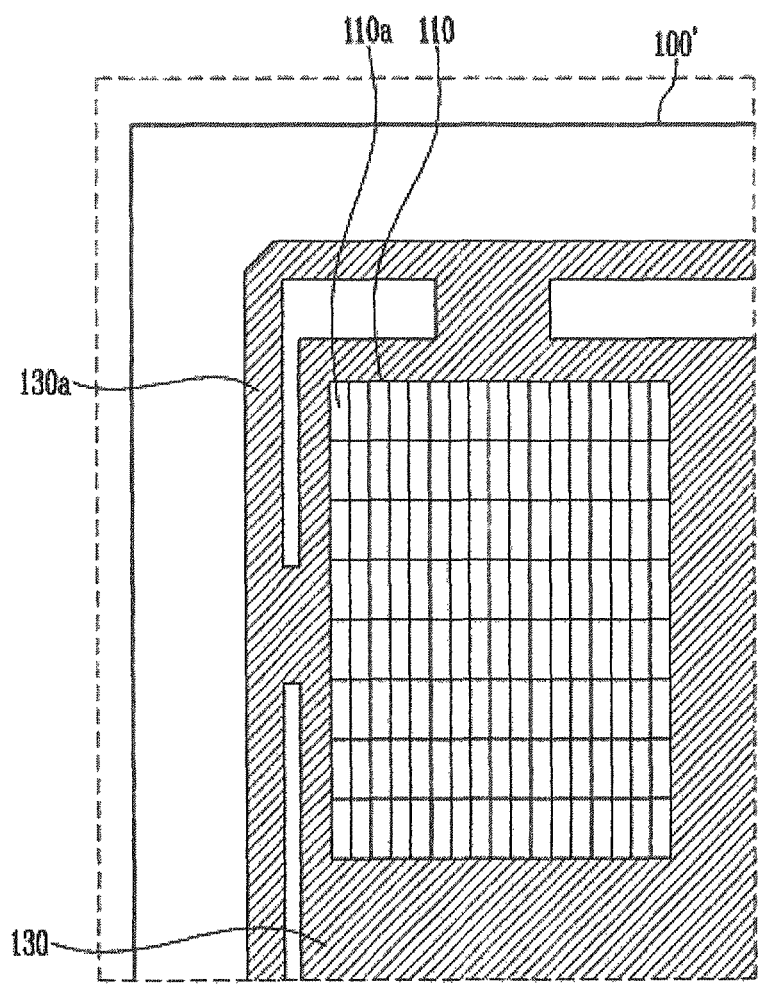
FIG. 5 is an enlarged plan view of area B in FIG. 4.

FIG. 4 is a plan view illustrating an example of a master glass according to an embodiment of the present invention. FIG. 5 is an enlarged plan view of area B in FIG. 4. For convenience of illustration, portions in FIGS. 4 and 5, identical or similar to those in FIGS. 1 and 3 are designated by like reference numerals, and their detailed descriptions will be omitted.

Referring to FIGS. 4 and 5, the master glass 100' according to an embodiment of the present invention includes second conductive pattern 130 through which first conductive patterns 110 are all connected electrically to one another.

More specifically, the first conductive patterns 110 are formed in regions of cells 120 of the master glass 100', respectively corresponding to a plurality of organic light emitting display panels, which are to be formed on a substrate for electronic devices.

The second conductive pattern 130 is formed to entirely or partially cover a space between the cells 120. The second conductive pattern 130 electrically connects all the first conductive patterns 110 formed on the master glass 100' to one another. The second conductive pattern 130 may include a specific pattern having a specific arrangement of conductive layers or may include a solid conductive layer.

The master glass 100' of an embodiment of the present invention includes a shorting bar 130a. The shorting bar 130a is formed to surround all of the first conductive patterns 110. The shorting bar 130a is electrically connected to some of the first patterns 110 that are disposed on the outskirts of the array of the first conductive patterns 110. As shown in FIG. 4, the shorting bar 130a may be disposed on an edge portion of the substrate of the master glass 100', but the location of the shorting bar 130a is not limited to the edge of the substrate of the master glass 100'. Because the second conductive pattern 130 connects all of the first conductive patterns 110, the shorting bar 130a is eventually electrically connected to the second conductive pattern 130. The first conductive patterns 110 can be more stably connected to one another through the shorting bar 130a.

The second conductive pattern 130 and the shorting bar pattern 130a may be made of different materials or made of the same material. If the second conductive pattern 130 and the shorting bar 130a are made of the same material, they may be practically considered as one integrated component.

It will be apparent that although the first and second conductive patterns 110 and 130 are distinguished from each other for clear illustration, they may be integrally formed of the same material. For example, if the first and second conductive patterns 110 and 130 are made of the same material, the first and second conductive patterns 110 and 130 may be integrally formed on the master glass 100'. However, the embodiment of the present invention may include first and second conductive patterns 110 and 130, which are made of different materials from each other.

As described above, according to the present invention, conductive layers of the conductive patterns 110 and 130 formed on the master glass 100' are positioned in the region excluding the region corresponding to a deposition pattern (e.g., a pattern of the light emitting portion 220 on the mother substrate 200) of the substrate for electronic devices, and are electrically connected to one another.

That is, all the conductive patterns 110 and 130 formed on the master glass 100' are electrically connected to one another, so that all of the conductive patterns 110 and 130 are in an equipotential state. Accordingly, generation of static electricity is prevented, thereby preventing damage of the master glass 100', caused by the static electricity.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A master glass, comprising:
a plurality of first conductive patterns, each of the first conductive patterns being formed to correspond to a deposition pattern required in the substrate for electronic devices;
a second conductive pattern surrounding the plurality of the first conductive patterns, and electrically connecting the first conductive patterns to one another; and
a shorting bar formed at an edge portion of the master glass to surround the second conductive pattern, the shorting bar being connected to the first conductive patterns through the second conductive pattern.

2. The master glass according to claim 1, wherein the substrate for electronic devices includes a mother substrate for fabricating a plurality of organic light emitting display panels.

3. The master glass according to claim 2, wherein each of the first conductive patterns is formed aligned with one of the organic light emitting display panels of the substrate for electronic devices, and the second conductive pattern is formed in a space between the first conductive patterns.

4. The master glass according to claim 2, wherein the deposition pattern is a pattern of light emitting portions of each of the organic light emitting display panels on which an organic layer is formed, and conductive layers of each of the first conductive patterns are formed aligned with regions between the light emitting portions.

5. The master glass according to claim 4, wherein the first conductive patterns includes a lattice pattern.

6. The master glass according to claim 1, wherein the first and second conductive patterns are integrally formed of the same material.

7. The master glass according to claim 6, wherein the first and second conductive patterns are formed of the same metallic material.

8. The master glass according to claim 1, wherein the substrate for electronic devices includes a deposition substrate for fabricating display panels on which a deposition material is formed, and conductive layers of the first and second patterns are positioned aligned with the region excluding the region of the deposition substrate on which the deposition material is formed.

9. A master substrate, comprising:
a substrate;
a plurality of first conductive patterns formed on the substrate, each of the first conductive patterns being formed to correspond to a deposition pattern required in the substrate for electronic devices;

a second conductive pattern surrounding the plurality of the first conductive patterns, and formed on the substrate, the second conductive pattern electrically connecting the first conductive patterns to one another; and a shorting bar formed at an edge portion of the master glass to surround the second conductive pattern, the shorting bar being connected to the first conductive patterns through the second conductive pattern.

10. The master substrate of claim 9, wherein each of the first conductive patterns includes a plurality of conductive layers, the conductive layers being formed aligned with regions of the deposition pattern on which a deposition material of the deposition pattern is not formed.

11. The master substrate of claim 9, wherein the first conductive patterns and the second conductive pattern are made of different materials.

12. The master substrate of claim 9, wherein the first conductive patterns and the second conductive pattern are made of the same material.

13. The master substrate of claim 9, wherein the second conductive pattern connects all of the first conductive patterns.

14. The master substrate of claim 9, wherein the substrate of the master substrate is made of the same material as the substrate for electronic devices.

\* \* \* \* \*